(12) United States Patent
Zhang (10) Patent No.: US 10,629,771 B2
(45) Date of Patent: Apr. 21, 2020

(54) PEROVSKITE LIGHT-EMITTING DIODE AND FABRICATING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Yunan Zhang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 305 days.

(21) Appl. No.: 15/736,476

(22) PCT Filed: Nov. 27, 2017

(86) PCT No.: PCT/CN2017/113055
§ 371 (c)(1),
(2) Date: Dec. 14, 2017

(87) PCT Pub. No.: WO2019/075856
PCT Pub. Date: Apr. 25, 2019

(65) Prior Publication Data
US 2020/0052154 A1 Feb. 13, 2020

(30) Foreign Application Priority Data
Oct. 17, 2017 (CN) .......................... 2017 1 0967310

(51) Int. Cl.
*H01L 51/00* (2006.01)
*H01L 33/06* (2010.01)
(Continued)

(52) U.S. Cl.
CPC .......... *H01L 33/06* (2013.01); *H01L 25/0753* (2013.01); *H01L 33/14* (2013.01);
(Continued)

(58) Field of Classification Search
CPC ... H01L 21/02; H01L 21/02197; H01L 21/31; H01L 21/31691; H01L 51/00;
(Continued)

(56) References Cited

U.S. PATENT DOCUMENTS

2006/0255722 A1* 11/2006 Imanishi ............. H01L 51/5206
313/504

FOREIGN PATENT DOCUMENTS

| CN | 1615060 A | 5/2005 |
| CN | 105185908 A | 12/2015 |

(Continued)

*Primary Examiner* — Chuong A Luu
(74) *Attorney, Agent, or Firm* — Hemisphere Law, PLLC; Zhigang Ma (57) ABSTRACT

The disclosure provides a perovskite light-emitting diode (LED) and a fabricating method thereof. The fabricating method of the perovskite LED of the disclosure fabricates a perovskite light-emitting layer by doping a suitable polymer material into the perovskite material. On one hand, the film-forming property of the perovskite material can be enhanced, and the pinholes in perovskite light-emitting layer are reduced and then the luminescence of perovskite LED can be enhanced; on the other hand, the physical properties of the inkjet ink of the perovskite light-emitting layer can be effectively adjusted to meet the needs of the inkjet printing process and to enhance the ink-jet printing effect of the perovskite light-emitting layer. The perovskite LED of the disclosure is fabricated by the method, and the perovskite light-emitting layer has good film-forming effect and basically no pinhole. Therefore, the perovskite LED has a better light-emitting performance.

7 Claims, 6 Drawing Sheets

(51) Int. Cl.
*H01L 33/26* (2010.01)
*H01L 25/075* (2006.01)
*H01L 33/40* (2010.01)
*H01L 33/50* (2010.01)
*H01L 33/14* (2010.01)

(52) U.S. Cl.
CPC .............. *H01L 33/26* (2013.01); *H01L 33/40* (2013.01); *H01L 33/504* (2013.01); *H01L 2933/0016* (2013.01); *H01L 2933/0041* (2013.01)

(58) Field of Classification Search
CPC ......... H01L 51/52; H01L 51/50; H01L 51/56; H01L 51/0077; H01L 51/5296; H01L 51/42; H01L 51/005; H01L 51/5012; H01L 51/5056; H01L 51/5072; H01L 51/4253; H01L 51/0049; H01L 51/004; H01L 51/5206; H01L 51/502; H01L 51/0034; H01L 51/0037; H01L 51/0072
USPC .............................................. 438/22, 24, 48
See application file for complete search history.

(56) References Cited

FOREIGN PATENT DOCUMENTS

| | | |
|---|---|---|
| CN | 105870287 | 8/2016 |
| CN | 105870349 | 8/2016 |
| CN | 106170877 A | 11/2016 |
| CN | 106450021 | 2/2017 |
| JP | 2003243726 | 8/2003 |

\* cited by examiner

PEROVSKITE LIGHT-EMITTING DIODE AND FABRICATING METHOD THEREOF

RELATED APPLICATIONS

The present application is a National Phase of International Application Number PCT/CN2017/113055, filed on Nov. 27, 2017, and claims the priority of China Application 201710967310.4, filed on Oct. 17, 2017.

FIELD OF THE DISCLOSURE

The disclosure relates to the field of display technology, and in particular, to a perovskite light-emitting diode and a fabricating method thereof.

BACKGROUND

The $ABX_3$-based perovskite material is named after the calcium titanate ($CaTiO_3$) compound first found in perovskites. The perovskite structure is characterized by a corner-sharing connection of X-octahedrons centered on the B-site cations and embedded in a tetragon with the B-site ion as the apex. The cation of A-site and B-site can be occupied by a single ion or a variety of ions. According to the types and the ionic radii of the cation of A-site and B-site, perovskite materials with different microstructures and different physical properties can be constructed.

Perovskite material is a solution processable semiconducting material with characteristics of low cost, high carrier mobility and large optical absorption coefficient. In recent years, perovskite materials have very good performance in the field of solar cells. In the meantime, perovskite materials have luminescent properties such as tunable emission wavelength and narrow emission spectrum, and also have great potential in the fields of electroluminescence and display.

At present, methods of fabricating perovskite films include sputtering, vapor deposition, screen printing, spin coating, blade coating, roller coating and ink-jet printing, among which the cost of sputtering and vapor deposition is high, the thickness and precision of screen printing are not well control light-emitting diode, spin coating is not suitable for mass production, but roller coating and ink-jet printing can be applied to low-cost, continuous, large-scale industrial production. Compared with the roller coating, ink-jet printing has the advantages of accurately control of thickness and position, micron-level resolution, capability of achieving full digital graphics output, flexibility and high precision control of process through the computer. Perovskite can be dispersed in solvent to prepare ink. By using the inkjet printing technology, the quantum dot material be can accurately deposited in the required position to form a precise pixel film, which is conducive to fabricate the perovskite light-emitting diode devices and reduce costs.

However, the existing perovskite materials generally have poor film-forming properties and pinholes formed during the film-forming process can easily lead to higher leakage current and lower current efficiency of the fabricated perovskite light-emitting diode devices.

SUMMARY

The object of the disclosure is to provide a fabricating method of a perovskite light-emitting diode, the method is capable of enhancing the film-forming property of the perovskite material and reducing the pinholes in perovskite light-emitting layer, and then the luminescence of perovskite light-emitting diode can be enhanced.

The object of the disclosure is also to provide a perovskite light-emitting diode, having good film-forming effect and basically no pinhole. Therefore, the perovskite light-emitting diode has a better light-emitting performance.

In order to achieve the object, the disclosure provides a fabricating method of a perovskite light-emitting diode, including:

providing a backplane, wherein the backplane includes a base substrate, a pixel defining layer disposed on the base substrate, a plurality of openings disposed on the pixel defining layer, and a plurality of anodes disposed on the base substrate and respectively located in the plurality of openings;

forming a plurality of hole transport layers on the plurality of anodes in the plurality of openings respectively;

forming a plurality of perovskite light-emitting layers on the plurality of hole transport layers in the plurality of openings respectively, and the perovskite light-emitting layer includes a perovskite material and a polymer material doped in the perovskite material;

forming a plurality of electron transport layers respectively on the perovskite light-emitting layers in the plurality of openings;

forming a plurality of cathodes respectively on the plurality of electron transport layers in the plurality of openings.

The mass percentage of the polymer material is of 10%-90% in the perovskite light-emitting layer and the perovskite material in the perovskite light-emitting layer is quantum dot particles.

the perovskite material includes one or more of an organometallic halide perovskite material and an inorganic perovskite material; the organometallic halide perovskite material includes one or more of $CH_3NH_3PbBr_3$ and $CH_3NH_3PbI_3$; the inorganic perovskite material includes $CsPbBr_3$; and the polymer material includes one or more of polyimide and polyethylene oxide;

The perovskite material in the perovskite light-emitting layer is $CH_3NH_3PbBr_3$, and the polymer material in the perovskite light-emitting layer is polyimide.

The plurality of perovskite light-emitting layers include a plurality of red perovskite light-emitting layers, a plurality of green perovskite light-emitting layers, and a plurality of blue perovskite light-emitting layers, the red perovskite light-emitting layer has a light-emitting wavelength of 630-690 nm, the green perovskite light-emitting layer has a light-emitting wavelength of 500-560 nm, and the blue perovskite light-emitting layer has a light-emitting wavelength of 420-480 nm.

The disclosure further provides a perovskite light-emitting diode, including a base substrate, a pixel defining layer disposed on the base substrate, a plurality of openings disposed on the pixel defining layer, a plurality of anodes disposed on the base substrate and respectively located in the plurality of openings, a plurality of hole transport layers respectively disposed in the plurality of openings and located on the plurality of anodes, a plurality of light-emitting layers respectively disposed in the plurality of openings and located on the plurality of hole transport layers, a plurality of electron transport layers disposed in the plurality of openings respectively and located on the plurality of light-emitting layers, and a plurality of cathodes disposed on the plurality of electron transport layers respectively;

the perovskite light-emitting layer includes a perovskite material and a polymer material doped in the perovskite material;

the mass percentage of the polymer material is of 10%-90% in the perovskite light-emitting layer; and the perovskite material in the perovskite light-emitting layer is quantum dot particles.

The perovskite material includes one or more of an organometallic halide perovskite material and an inorganic perovskite material; the organometallic halide perovskite material includes one or more of $CH_3NH_3PbBr_3$ and $CH_3NH_3PbI_3$; the inorganic perovskite material includes $CsPbBr_3$; and the polymer material includes one or more of polyimide and polyethylene oxide.

The perovskite material in the perovskite light-emitting layer is $CH_3NH_3PbBr_3$, and the polymer material in the perovskite light-emitting layer is polyimide.

The plurality of perovskite light-emitting layers include a plurality of red perovskite light-emitting layers, a plurality of green perovskite light-emitting layers, and a plurality of blue perovskite light-emitting layers, the red perovskite light-emitting layer has a light-emitting wavelength of 630-690 nm, the green perovskite light-emitting layer has a light-emitting wavelength of 500-560 nm, and the blue perovskite light-emitting layer has a light-emitting wavelength of 420-480 nm.

The disclosure also provides a method of making a perovskite light-emitting diode, including:

providing a backplane, wherein the backplane includes a base substrate, a pixel defining layer disposed on the base substrate, a plurality of openings disposed on the pixel defining layer, and a plurality of anodes disposed on the base substrate and respectively located in the plurality of openings;

forming a plurality of hole transport layers on the plurality of anodes in the plurality of openings respectively;

forming a plurality of perovskite light-emitting layers on the plurality of hole transport layers in the plurality of openings respectively, and the perovskite light-emitting layer includes a perovskite material and a polymer material doped in the perovskite material;

forming a plurality of electron transport layers respectively on the perovskite light-emitting layers in the plurality of openings;

forming a plurality of cathodes respectively on the plurality of electron transport layers in the plurality of openings;

the mass percentage of the polymer material is of 10%-90% in the perovskite light-emitting layer; and the perovskite material in the perovskite light-emitting layer is quantum dot particles;

the perovskite material includes one or more of an organometallic halide perovskite material and an inorganic perovskite material; the organometallic halide perovskite material includes one or more of $CH_3NH_3PbBr_3$ and $CH_3NH_3PbI_3$; the inorganic perovskite material includes $CsPbBr_3$; and the polymer material includes one or more of polyimide and polyethylene oxide;

the plurality of perovskite light-emitting layers include a plurality of red perovskite light-emitting layers, a plurality of green perovskite light-emitting layers, and a plurality of blue perovskite light-emitting layers, the red perovskite light-emitting layer has a light-emitting wavelength of 630-690 nm, the green perovskite light-emitting layer has a light-emitting wavelength of 500-560 nm, and the blue perovskite light-emitting layer has a light-emitting wavelength of 420-480 nm.

The beneficial effect of the disclosure is that the fabricating method of the perovskite light-emitting diode of the disclosure fabricates a perovskite light-emitting layer by doping a suitable polymer material into the perovskite material, on one hand, the film-forming property of the perovskite material can be enhanced, and the pinholes in perovskite light-emitting layer are reduced and then the luminescence of perovskite light-emitting diode can be enhanced; on the other hand, the physical properties of the inkjet ink of the perovskite light-emitting layer can be effectively adjusted to meet the needs of the inkjet printing process and to enhance the ink-jet printing effect of the perovskite light-emitting layer. The perovskite light-emitting diode of the disclosure is fabricated by the method. The perovskite light-emitting layer has good film-forming effect and basically no pinhole. Therefore, the perovskite light-emitting diode has a better light-emitting performance.

For further understanding of the features and technical contents of the disclosure, reference should be made to the following detailed description and accompanying drawings of the disclosure. However, the drawings are for reference only and are not intended to limit the disclosure.

BRIEF DESCRIPTION OF THE DRAWINGS

The technical proposal of the disclosure and other advantageous effects will be apparent from the following detailed description of specific embodiments of the disclosure taken in conjunction with the accompanying drawings.

In the drawings.

DETAILED DESCRIPTION OF PREFERRED EMBODIMENTS

To further illustrate the technical means adopted by the disclosure and the effects thereof, the following describes in detail the preferred embodiments of the disclosure and the accompanying drawings.

Figure 1:
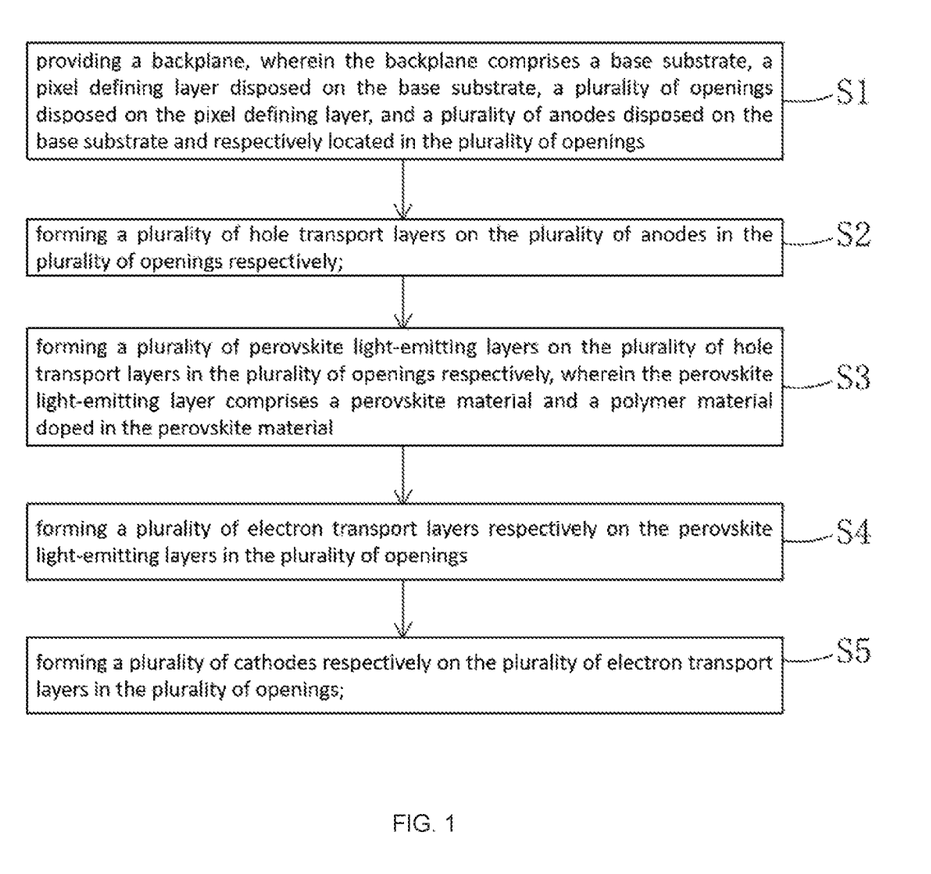
FIG. 1 is a flowchart of a fabricating method of a perovskite light-emitting diode of the disclosure.
Figure 2:
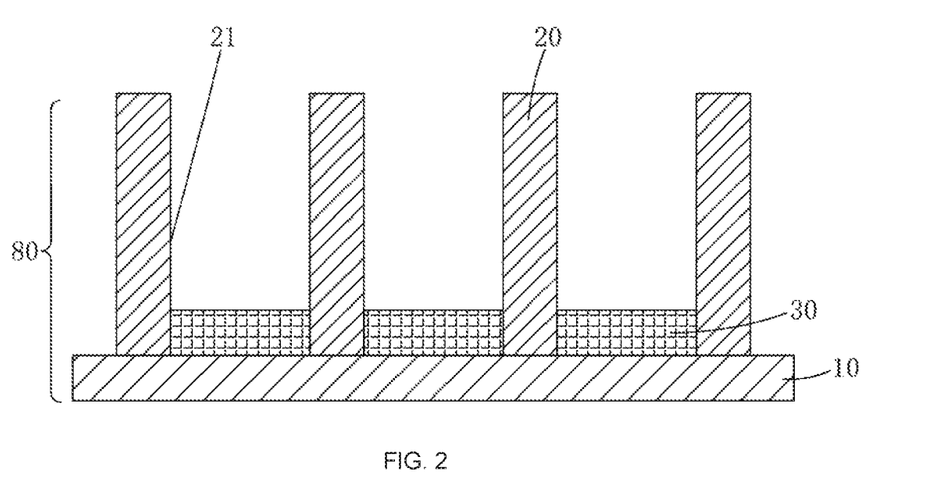
FIG. 2 is a schematic diagram of step S1 of the fabricating method of a perovskite light-emitting diode of the disclosure.

Referring to FIG. 1, the disclosure provides a fabricating method of a perovskite light-emitting diode, including the steps as follows:

In step S1, as shown in FIG. 2, providing a backplane 80, wherein the backplane 80 includes a base substrate 10, a pixel defining layer 20 disposed on the base substrate 10, a plurality of openings 21 disposed on the pixel defining layer 20, and a plurality of anodes 30 disposed on the base substrate 10 and respectively located in the plurality of openings 21.

Specifically, the base substrate 10 is a TFT substrate.

Specifically, the plurality of openings 21 respectively correspond to a plurality of pixel regions.

Specifically, the materials of the plurality of anodes 30 include one or more of ITO (indium tin oxide) and FTO (fluorine-doped tin dioxide), and the plurality of anodes 30 are formed by magnetron sputtering, and the film thickness of the anode 30 is between 20 nm and 200 nm.

Specifically, the pixel defining layer 20 is made of organic material.

Figure 3:
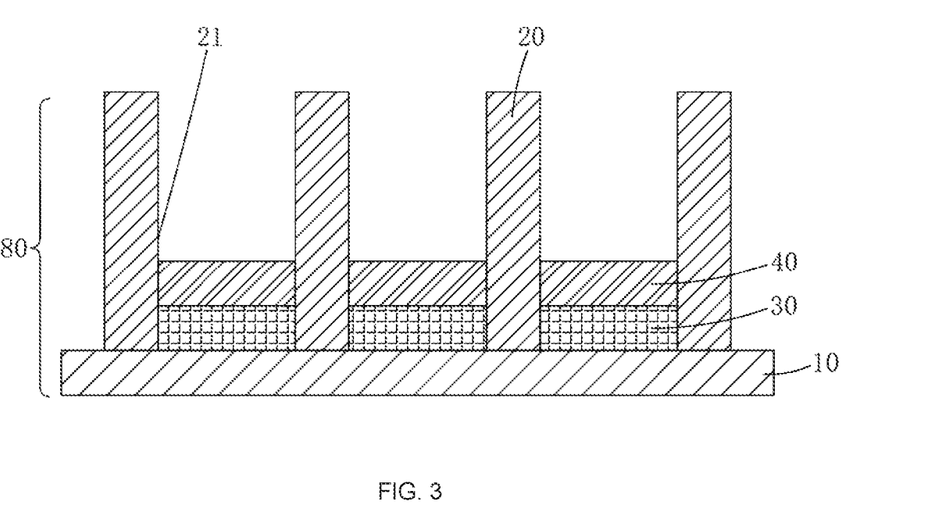
FIG. 3 is a schematic diagram of step S2 of the fabricating method of a perovskite light-emitting diode of the disclosure.

In step S2, as shown in FIG. 3, forming a plurality of hole transport layers 40 on the plurality of anodes 30 in the plurality of openings 21 respectively.

Specifically, the hole transport layer 40 includes an organic small molecule hole transport material or a polymer hole transport material.

Preferably, the organic small molecule hole transporting material is Spiro-MeOTAD ($N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine), and the formula of Spiro-MeOTAD is Preferably, the polymer hole transporting material is PEDOT:PSS (Polyphonic (3,4-ethylenedioxythiophene): poly (styrene-sulfonate)).

Specifically, the hole transport layer 40 is fabricated by a wet film-forming method. Preferably, the wet film-forming method is ink-jet printing.

Specifically, the film thickness of the hole transport layer 40 is between 1 nm and 100 nm.

Figure 4:
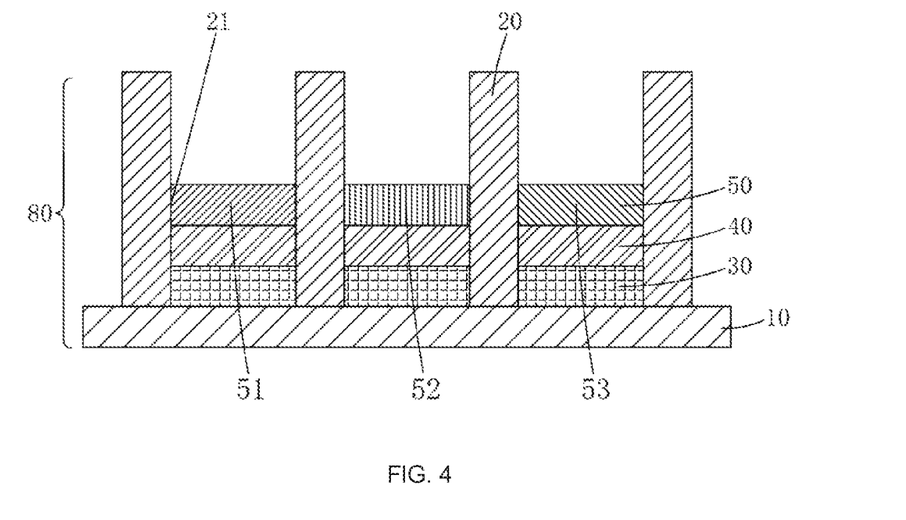
FIG. 4 is a schematic diagram of step S3 of the fabricating method of a perovskite light-emitting diode of the disclosure.

In step S3, as shown in FIG. 4, forming a plurality of perovskite light-emitting layers 50 on the plurality of hole transport layers 40 in the plurality of openings 21 respectively, and the perovskite light-emitting layer 50 includes a perovskite material and a polymer material doped in the perovskite material.

Specifically, in the perovskite light-emitting layer 50, the mass percentage of the polymer material is 10%-90%.

Specifically, the perovskite material in the perovskite light-emitting layer 50 is a quantum dot particle, which has the advantages of narrow emission spectrum and high color purity. Depending on the size, the color of the quantum dot particles glows differently.

Specifically, the perovskite material includes one or more of an organometallic halide perovskite material and an inorganic perovskite material. The organometallic halide perovskite material includes one or more of $CH_3NH_3PbBr_3$ and $CH_3NH_3PbI_3$; the inorganic material includes a perovskite $CsPbBr_3$.

Specifically, the polymeric material includes one or more of polyimide (PIP) and polyethylene oxide (PEO).

Most preferably, the perovskite material in the perovskite light-emitting layer is a $CH_3NH_3PbBr_3$ (MAPbBr3), and the polymer material in the perovskite emitting layer 50 is PIP.

Specifically, the plurality of perovskite light-emitting layers 50 include a plurality of red perovskite light-emitting layers 51, a plurality of green perovskite light-emitting layers 52, and a plurality of blue perovskite light-emitting layers 53, and the red perovskite light-emitting layer 52 has a light-emitting wavelength of 630-690 nm, the green perovskite light-emitting layer 53 has a light-emitting wavelength of 500-560 nm, and the blue perovskite light-emitting layer 54 has a light-emitting wavelength of 420-480 nm. This shows that the chromatography of red, green, and blue light emitted from red light-emitting layer perovskite 51, the green perovskite light-emitting layer 52, and the blue perovskite light-emitting layer 53 is narrow and the color purity is higher, so that the color gamut and color saturation of the display using the perovskite light-emitting diode of the disclosure can be improved.

Specifically, the perovskite light-emitting layer 50 is fabricated by a wet film-forming method. Preferably, the wet film-forming method is ink-jet printing.

Specifically, the film thickness of the perovskite light-emitting layer 50 is between 1 nm and 200 nm. Preferably, the film thickness of the perovskite light-emitting layer 50 is between 10 nm and 200 nm.

In the disclosure, the perovskite light-emitting layer 50 is doped by a polymer material into the perovskite material. On one hand, the film-forming property of the perovskite material can be enhanced, and the pinholes in perovskite light-emitting layer 50 are reduced and then the luminescence of perovskite light-emitting diode can be enhanced; on the other hand, the physical properties of the inkjet ink of the perovskite light-emitting layer 50 can be effectively adjusted to meet the needs of the inkjet printing process and to enhance the ink-jet printing effect of the perovskite light-emitting layer 50.

Figure 5:
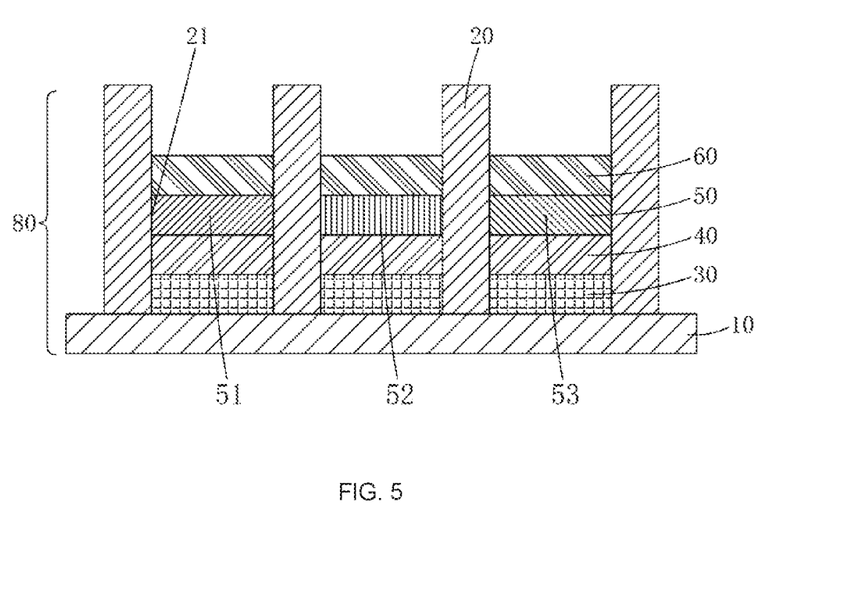
FIG. 5 is a schematic diagram of step S4 of the fabricating method of a perovskite light-emitting diode of the disclosure.

In step S4, as shown in FIG. 5, forming a plurality of electron transport layers 60 respectively on the perovskite light-emitting layers 50 in the plurality of openings 21.

Specifically, the material of the electron transport layer 60 includes one or more of an organic electron transport material and a metal oxide.

Preferably, the organic electron transport material is 1,3,5-Tris(1-phenyl-1H-benzimidazol-2-yl)benzene (TPBI); and the metal oxide is titanium oxide (TiO2).

Specifically, the electron transport layer 60 is fabricated by a vapor deposition method or a wet film-forming method.

Specifically, when the material of the electron transport layer 60 is an organic electron transport material, the hole transport layer 40 is fabricated by a vapor deposition method; when the material of the electron transport layer 60 is a metal oxide, the hole transport layer 40 is fabricated by a wet film-forming method.

Specifically, the film thickness of the electron transport layer 60 is between 1 nm and 100 nm. Preferably, the film thickness of the electron transport layer 60 is between 5 nm and 50 nm.

Figure 6:
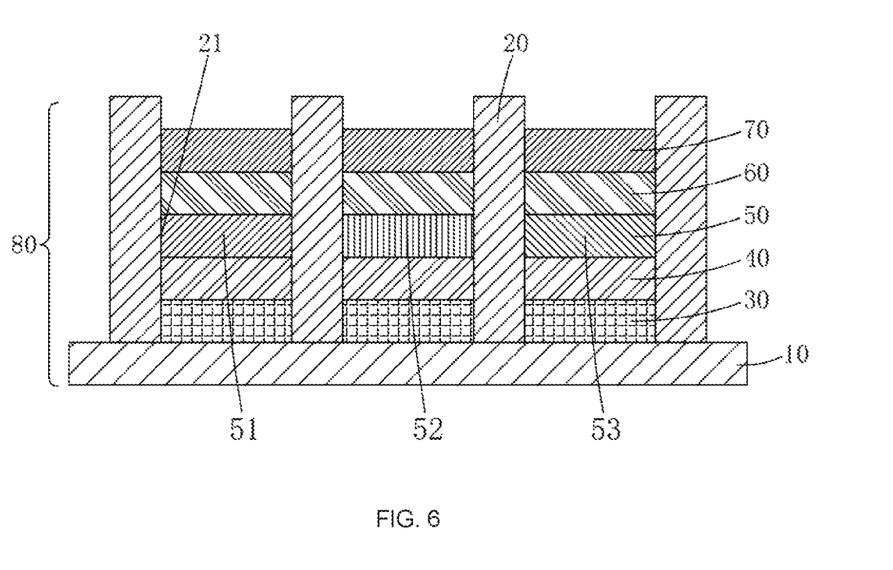
FIG. 6 is a schematic diagram of step S5 of the fabricating method of a perovskite light-emitting diode of the disclosure and a schematic diagram of a structure of the perovskite light-emitting diode of the disclosure.

In step S5, as shown in FIG. 6, forming a plurality of cathodes 70 respectively on the plurality of electron transport layers 60 in the plurality of openings 21.

Specifically, the material of the cathode 70 is a commonly used low work function metal material. Preferably, the material of the cathode 70 include one or more of lithium (Li), magnesium (Mg), calcium (Ca), strontium (Sr), lanthanum (La), cerium (Ce), europium (Eu), ytterbium (Yb), Aluminum (Al), cesium (Cs), rubidium (Rb), and alloys of the above metals.

Specifically, the cathode 70 is fabricated by vacuum evaporation.

Specifically, the film thickness of the cathode 90 is between 10 nm and 200 nm.

Preferably, the cathode 70 includes a first cathode film (not shown) disposed on the electron transport layer 60 and a second cathode film (not shown) disposed on the first cathode film, and the material of the first cathode film is calcium (Ca), the thickness of the first cathode film is between 0.5 nm and 30 nm, the material of the second cathode film is aluminum (Al), the thickness of the second cathode film is between 50 nm and 2000 nm, both the first cathode film and the second cathode film are fabricated by vacuum evaporation.

The fabricating method of the perovskite light-emitting diode of the disclosure fabricates a perovskite light-emitting layer 50 by doping a suitable polymer material into the perovskite material. On one hand, the film-forming property of the perovskite material can be enhanced, and the pinholes in perovskite light-emitting layer 50 are reduced and then the luminescence of perovskite light-emitting diode can be enhanced; on the other hand, the physical properties of the inkjet ink of the perovskite light-emitting layer 50 can be effectively adjusted to meet the needs of the inkjet printing process and to enhance the ink-jet printing effect of the perovskite light-emitting layer 50.

Referring to FIG. 6, based on the fabricating method of the perovskite light-emitting diode, the disclosure further provides a perovskite light-emitting diode, including a base substrate 10, a pixel defining layer 20 disposed on the base substrate 10, a plurality of openings 21 disposed on the pixel defining layer 20, a plurality of anodes 30 disposed on the base substrate 10 and respectively located in the plurality of openings 21, a plurality of hole transport layers 40 respectively disposed in the plurality of openings 21 and located on the plurality of anodes 30, a plurality of light-emitting layers 50 respectively disposed in the plurality of openings 21 and located on the plurality of hole transport layers 40, a plurality of electron transport layers 60 disposed in the plurality of openings 21 respectively and located on the plurality of light-emitting layers 50, and a plurality of cathodes 70 disposed on the plurality of electron transport layers 60 respectively;

the perovskite light-emitting layer 50 includes a perovskite material and a polymer material doped in the perovskite material.

Specifically, when the perovskite light-emitting diode is in operation, the anode 30 injects holes into the hole transport layer 40, the hole transport layer 40 assists in the transport of holes from the anode 30 to the light-emitting layer 50, and the cathode 70 injects electrons into the electron transport layer 60, the electron transport layer 60 assists in the transport of electrons from the cathode 70 into the light-emitting layer 50, and holes and electrons are recombined in the light-emitting layer 50 to emit light.

Specifically, the base substrate 10 is a TFT substrate.

Specifically, the plurality of openings 21 respectively correspond to a plurality of pixel regions.

Specifically, the materials of the plurality of anodes 30 include one or more of ITO (indium tin oxide) and FTO (fluorine-doped tin dioxide), and a film thickness of the plurality of anodes 30 is between 20 nm and 200 nm.

Specifically, the pixel defining layer 20 is made of organic material.

Specifically, the hole transport layer 40 includes an organic small molecule hole transport material or a polymer hole transport material.

Preferably, the organic small molecule hole transporting material is Spiro-MeOTAD, and the formula of Spiro-MeOTAD is Preferably, the polymer hole transporting material is PEDOT:PSS.

Specifically, the film thickness of the hole transport layer 40 is between 1 nm and 100 nm.

Specifically, in the perovskite light-emitting layer 50, the mass percentage of the polymer material is 10%-90%.

Specifically, the perovskite material in the perovskite light-emitting layer 50 is a quantum dot particle, which has the advantages of narrow emission spectrum and high color purity. Depending on the size, the color of the quantum dot particles glows differently.

Specifically, the perovskite material includes one or more of an organometallic halide perovskite material and an inorganic perovskite material.

Preferably, the organometallic halide perovskite material includes one or more of $CH_3NH_3PbBr_3$ and $CH_3NH_3PbI_3$; the inorganic material includes a perovskite $CsPbBr_3$.

Specifically, the polymeric material includes one or more of polyimide (PIP) and polyethylene oxide (PEO).

Most preferably, the perovskite material in the perovskite light-emitting layer is a $CH_3NH_3PbBr_3$ (MAPbBr3), and the polymer material in the perovskite emitting layer 50 is PIP.

Specifically, the plurality of perovskite light-emitting layers 50 include a plurality of red perovskite light-emitting layers 51, a plurality of green perovskite light-emitting layers 52, and a plurality of blue perovskite light-emitting layers 53, and the red perovskite light-emitting layer 52 has a light-emitting wavelength of 630-690 nm, the green perovskite light-emitting layer 53 has a light-emitting wavelength of 500-560 nm, and the blue perovskite light-emitting layer 54 has a light-emitting wavelength of 420-480 nm. This shows that the chromatography of red, green, and blue light emitted from red light-emitting layer perovskite 51, the green perovskite light-emitting layer 52, and the blue perovskite light-emitting layer 53 is narrow and the color purity is higher, so that the color gamut and color saturation of the display using the perovskite light-emitting diode of the disclosure can be improved.

Specifically, the film thickness of the perovskite light-emitting layer 50 is between 1 nm and 200 nm. Preferably, the film thickness of the perovskite light-emitting layer 50 is between 10 nm and 200 nm.

Specifically, the material of the electron transport layer 60 includes one or more of an organic electron transport material and a metal oxide.

Preferably, the organic electron transport material is 1,3, 5-Tris(1-phenyl-1H-benzimidazol-2-yl) benzene (TPBI), and the metal oxide is titanium oxide (TiO2).

Specifically, the electron transport layer 60 is fabricated by a vapor deposition method or a wet film-forming method.

Specifically, when the material of the electron transport layer 60 is an organic electron transport material, the hole transport layer 40 is fabricated by a vapor deposition method; when the material of the electron transport layer 60 is a metal oxide, the hole transport layer 40 is fabricated by a wet film-forming method.

Specifically, the film thickness of the electron transport layer 60 is between 1 nm and 100 nm. Preferably, the film thickness of the electron transport layer 60 is between 5 nm and 50 nm.

Specifically, the material of the cathode 70 is a commonly used low work function metal material. Preferably, the material of the cathode 70 include one or more of lithium (Li), magnesium (Mg), calcium (Ca), strontium (Sr), lanthanum (La), cerium (Ce), europium (Eu), ytterbium (Yb), Aluminum (Al), cesium (Cs), rubidium (Rb), and alloys of the above metals.

Specifically, the film thickness of the cathode 90 is between 50 nm and 3000 nm.

Preferably, the cathode 70 includes a first cathode film (not shown) disposed on the electron transport layer 60 and a second cathode film (not shown) disposed on the first cathode film, and the material of the first cathode film is calcium (Ca), the thickness of the first cathode film is between 0.5 nm and 30 nm, the material of the second cathode film is aluminum (Al), the thickness of the second cathode film is between 50 nm and 2000 nm.

In the disclosure, the perovskite light-emitting layer 50 is doped by a polymer material into the perovskite material. On one hand, the film-forming property of the perovskite material can be enhanced, and the pinholes in perovskite light-emitting layer 50 are reduced and then the luminescence of perovskite light-emitting diode can be enhanced; on the other hand, the physical properties of the inkjet ink of the perovskite light-emitting layer 50 can be effectively adjusted to meet the needs of the inkjet printing process and to enhance the ink-jet printing effect of the perovskite light-emitting layer 50.

In summary, the disclosure provides a perovskite light-emitting diode and a fabricating method thereof. The fabricating method of the perovskite light-emitting diode of the disclosure fabricates a perovskite light-emitting layer by doping a suitable polymer material into the perovskite material, on one hand, the film-forming property of the perovskite material can be enhanced, and the pinholes in perovskite light-emitting layer are reduced and then the luminescence of perovskite light-emitting diode can be enhanced; on the other hand, the physical properties of the inkjet ink of the perovskite light-emitting layer can be effectively adjusted to meet the needs of the inkjet printing process and to enhance the ink-jet printing effect of the perovskite light-emitting layer. The perovskite light-emitting diode of the disclosure is fabricated by the above method. The perovskite light-emitting layer has good film-forming effect and basically no pinhole. Therefore, the perovskite light-emitting diode has a better light-emitting performance.

As described above, it will be apparent to those skilled in the art that various other changes and modifications may be made in accordance with the technical solutions and technical concepts of the disclosure, and all such changes and modifications are subject to be included in the scope of protection of the appended claims.

What is claimed is:

1. A fabricating method of a perovskite light-emitting diode, comprising:
   providing a backplane, wherein the backplane comprises a base substrate, a pixel defining layer disposed on the base substrate, a plurality of openings disposed on the pixel defining layer, and a plurality of anodes disposed on the base substrate and respectively located in the plurality of openings;
   forming a plurality of hole transport layers on the plurality of anodes in the plurality of openings respectively;
   forming a plurality of perovskite light-emitting layers on the plurality of hole transport layers in the plurality of openings respectively, wherein the perovskite light-emitting layer comprises a perovskite material and a polymer material doped in the perovskite material;
   forming a plurality of electron transport layers respectively on the perovskite light-emitting layers in the plurality of openings; and
   forming a plurality of cathodes respectively on the plurality of electron transport layers in the plurality of openings.

2. The fabricating method of the perovskite light-emitting diode according to claim 1, wherein a mass percentage of the polymer material is of 10%-90% in the perovskite light-emitting layer; and the perovskite material in the perovskite light-emitting layer is quantum dot particles.

3. The fabricating method of the perovskite light-emitting diode according to claim 1, wherein the perovskite material comprises one or more of an organometallic halide perovskite material and an inorganic perovskite material; and the organometallic halide perovskite material comprises one or more of CH3NH3PbBr3 and CH3NH3PbI3; the inorganic perovskite material comprises CsPbBr3; and the polymer material comprises one or more of polyimide and polyethylene oxide.

4. The fabricating method of the perovskite light-emitting diode according to claim 3, wherein the perovskite material in the perovskite light-emitting layer is CH3NH3PbBr3, and the polymer material in the perovskite light-emitting layer is polyimide.

5. The fabricating method of the perovskite light-emitting diode according to claim 1, wherein the plurality of perovskite light-emitting layers comprise a plurality of red perovskite light-emitting layers, a plurality of green perovskite light-emitting layers, and a plurality of blue perovskite light-emitting layers; the red perovskite light-emitting layer has a light-emitting wavelength of 630-690 nm, the green perovskite light-emitting layer has a light-emitting wavelength of 500-560 nm, and the blue perovskite light-emitting layer has a light-emitting wavelength of 420-480 nm.

6. A fabricating method of a perovskite light-emitting diode, comprising:
   providing a backplane, wherein the backplane comprises a base substrate, a pixel defining layer disposed on the base substrate, a plurality of openings disposed on the pixel defining layer, and a plurality of anodes disposed on the base substrate and respectively located in the plurality of openings;
   forming a plurality of hole transport layers on the plurality of anodes in the plurality of openings respectively;

forming a plurality of perovskite light-emitting layers on the plurality of hole transport layers in the plurality of openings respectively, wherein the perovskite light-emitting layer comprises a perovskite material and a polymer material doped in the perovskite material;

forming a plurality of electron transport layers respectively on the perovskite light-emitting layers in the plurality of openings; and forming a plurality of cathodes respectively on the plurality of electron transport layers in the plurality of openings;

wherein a mass percentage of the polymer material is of 10%-90% in the perovskite light-emitting layer; and the perovskite material in the perovskite light-emitting layer is quantum dot particles;

wherein the perovskite material comprises one or more of an organometallic halide perovskite material and an inorganic perovskite material; the organometallic halide perovskite material comprises one or more of $CH_3NH_3PbBr_3$ and $CH_3NH_3PbI_3$; the inorganic perovskite material comprises $CsPbBr_3$; and the polymer material comprises one or more of polyimide and polyethylene oxide;

wherein the plurality of perovskite light-emitting layers comprise a plurality of red perovskite light-emitting layers, a plurality of green perovskite light-emitting layers, and a plurality of blue perovskite light-emitting layers, the red perovskite light-emitting layer has a light-emitting wavelength of 630-690 nm, the green perovskite light-emitting layer has a light-emitting wavelength of 500-560 nm, and the blue perovskite light-emitting layer has a light-emitting wavelength of 420-480 nm.

7. The fabricating method of the perovskite light-emitting diode according to claim 6, wherein the perovskite material in the perovskite light-emitting layer is $CH_3NH_3PbBr_3$, and the polymer material in the perovskite light-emitting layer is polyimide.

* * * * *